United States Patent [19]

Böhm et al.

[11] Patent Number: 4,835,427
[45] Date of Patent: May 30, 1989

[54] THREE-PHASE ALTERNATOR DIODE HEAT SINK STRUCTURE

[75] Inventors: Herbert Böhm, Wannweil; Lothar Gademann, Rottenburg; Richard Spitz, Reutlingen, all of Fed. Rep. of Germany

[73] Assignee: Robert Bosch GmbH, Stuttgart, Fed. Rep. of Germany

[21] Appl. No.: 165,776

[22] Filed: Mar. 9, 1988

[30] Foreign Application Priority Data

Apr. 2, 1987 [DE] Fed. Rep. of Germany ....... 3711192

[51] Int. Cl.4 .......................... H02K 9/12; H05K 7/20
[52] U.S. Cl. ..................................... 310/68 D; 310/71; 357/81
[58] Field of Search .............. 310/64, 71, 68 D, 68 R; 165/80.2; 357/81

[56] References Cited

U.S. PATENT DOCUMENTS 4,307,437  12/1981  Severing ............................. 310/68 D
4,321,664  3/1982  Matthai ............................. 310/68 D

OTHER PUBLICATIONS

Robert Bosch Technical Instruction Manual, Dec. '82, pp. 30–31, ISBN 3-18-418004-2.

*Primary Examiner*—Patrick R. Salce
*Assistant Examiner*—D. L. Rebsch
*Attorney, Agent, or Firm*—Frishauf, Holtz, Goodman & Woodward

[57] ABSTRACT

To reduce the size of a rectifier structure in a vehicular alternator-rectifier combination, a common carrier plate of essentially half-moon or sickle shape, having two wing portions separated by a central portion (31) retains two support plates (20) of essentially square outline. Groups of positive and negative diodes are located in the vicinity of the corners of the essentially square suppport plates, interconnected by connecting buses extending in chord relation with respect to the common carrier plate (22). Exciter or field diodes (13, 33) are positioned in the central portion, free from the support plates and the positive and negative diodes thereon. Four positive and negative diodes can be provided, in which a fourth diode pair (16) is connected to a star or center terminal of the alternator winding. The common carrier plate is formed with an upstanding rim so that the entire rectifier can be encapsulating in a potting or resin compound.

20 Claims, 4 Drawing Sheets

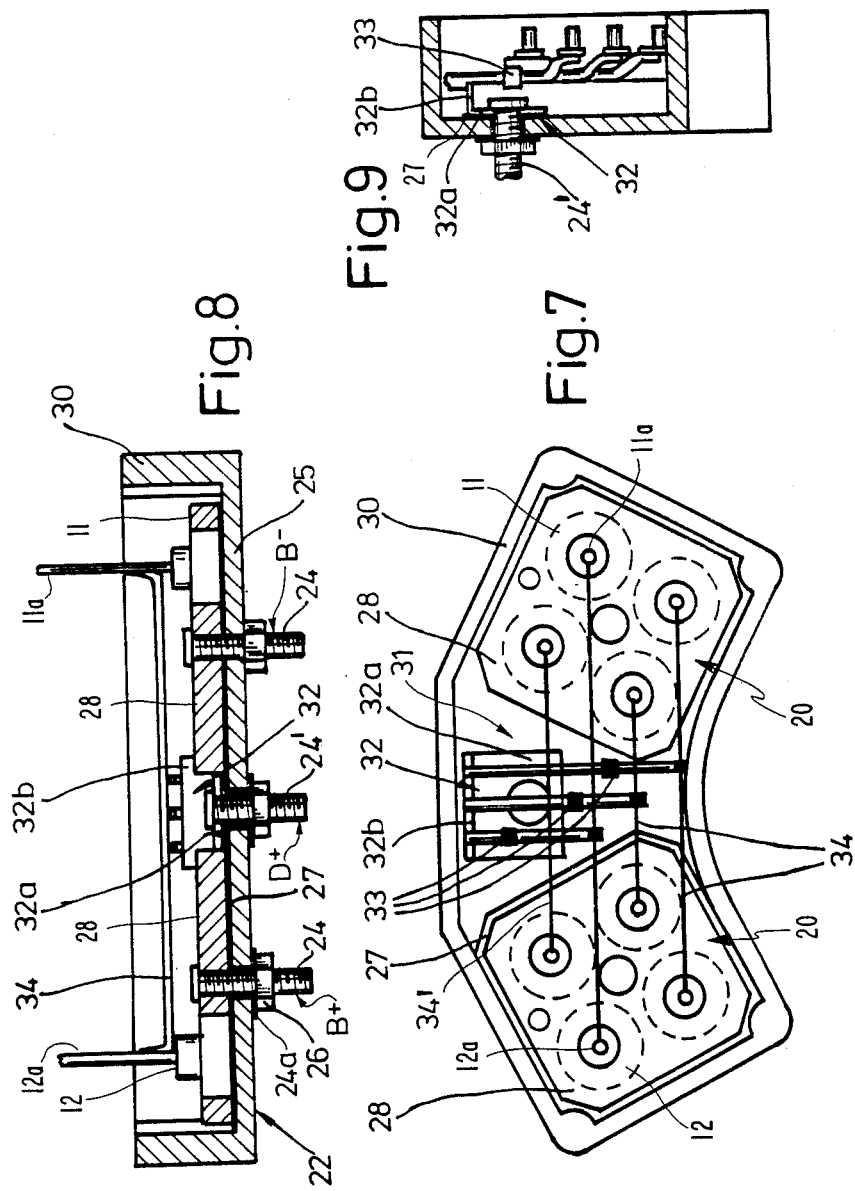

THREE-PHASE ALTERNATOR DIODE HEAT SINK STRUCTURE

The present invention relates to vehicular-type three-phase alternators, and more particularly to such alternators in combination with rectifiers, in which rectifier diodes are located on structures assembled with and directly connected to the alternator.

BACKGROUND

Vehicular-type alternators, and more particularly automotive-type alternators, are frequently combined with rectifier structures to provide direct current output to connected batteries. One well known and suitable structure is described in the Robert Bosch Technical Instruction Manual VDT-UBE 315/30 of Dec. 1970, page 24, in the German language; a corresponding English-language version is available under No. VDT-U 1/8 En, of Dec. 1982, pages 30 and 31. The rectifier system there described shows two cooling structures located within the alternator. The cooling structures are formed as carrier sheet metal or plate elements, each of which has three positive diodes and three negative diodes located. Positive diodes are defined as diodes in which the anode is connected to an extended lead, whereas the diode housing forms the cathode; negative diodes are defined as diodes in which the cathode is brought out as a connecting lead, whereas the casing or housing of the diode forms the positive terminal. This definition will be used throughout the specification.

The extending lead wires or head wires of a diode pair are connected to respective phase terminals of the alternator; the plates in which the diodes are secured form the positive and negative output terminals of the rectifier system. In addition to the diodes connected in this manner, and which carry the power output current from the alternator, three further diodes are provided which are connected to supply direct current to the field of the alternator. These field-supplying diodes, also referred to as exciter diodes, have their anodes connected to the respective phase terminals of the alternator. The cathodes are connected together and form the D= terminal of the generator.

Alternator-rectifier combinations are used in numerous mobile installations, and the most widespread use, probably, is in vehicular installations. Of course, other installations are also possible. Yet, since the mobile installation is of primary importance, alternators specifically designed for such use will be explained in detail.

U.S. Pat. No. 4,307,437, Severing, assigned to the assignee of the present application and the disclosure of which is hereby incorporated by reference, is directed to an alternator housing which supports metal strips which function as carriers for the diodes. The free or lead wire connections of the diodes are interconnected by V-shaped bent metal strips, constructed as sheet metal elements. The connecting strips, due to their V shape can be fitted somewhat within the round outline of an alternator housing. They function as cooling fins or cooling structures and can be located within the cooling stream of the alternator. Air guide vanes may additionally be provided to guide cooling air to the diodes and to the metal strips.

It is generally known to construct a support arrangement for the power diodes of the rectifier and a cooling arrangement for the rectifier in such a manner that two large-area circular ring segments of a suitable metal, such as aluminum or copper, are formed with three through-bores. Each one of the segments has the respective three power diodes press-fitted into the boards, to form the rectifier system for the alternator-rectifier combination. This structure provides the required six power diodes which form the dc rectification system for the output terminals of the alternator. The circular ring segments, forming the group elements for the positive and negative terminals, can be secured to a circular plastic component, for example by riveting. Each one of the power diodes is constructed in pot-shaped form that is, it includes a silicon chip which is soldered to provide an electrical connection between the base of the diode and a further solder connection to the head wire. The base, typically circular, may be formed with ribbed or knurled circumference for press-fitting into a suitable opening.

After inserting the silicon chip into the base, it is cleaned, and the surfaces of the solder-connected chips are coated with a lacquer for conservation and to protect the chip and the solder connections against mechanical damage or aggressive environmental influences. The finished diodes are then encapsulated in a suitable plastic material so that from one side only the head wire extends, and on the other side only a ring of the base is accessible. Since the diodes, in operation, are highly current-loaded, the rings are press-fitted into the openings of the respective holding elements, usually in plate or sheet form, to provide, simultaneously, mechanical retention as well as a cooling surface and heat sink. For good heat exchange, the bases are made as large as possible and, frequently, are made of copper.

Prior art diodes of this type may have a base diameter at the press-fitted ring zone of 13 mm; each diode weighs about 6.2 g. These figures are given only as an illustration for one type of diode, to permit comparison with the structure of the present invention, to be described below.

A complete rectifier structure, thus, has two groups, each of which has at least three power diodes. One group retains only the positive diodes, in which the anode forms the extended or head lead, and the other group only the negative diodes, in which the cathode forms the extending or head lead. The plastic component or support on which the respective groups are then secured, for example by riveting, contain the required connecting bridges between the head leads of one each positive and negative diode, associated to one specific phase of the alternator, and connected to a phase terminal thereof. This requires connection of the head leads to the connecting bridge elements on or in the plastic part, for example by a weld connection.

The system works well and is reliable. To obtain sufficient cooling, however, with ever-increasing power demands on alternators, it is necessary to use connecting plates of each group of substantial size. Numerically, such connecting plates may have a surface of, for example, 40 cm². The group components generally fit the circular shape of alternator housings and are secured within the alternator to be exposed to the cooling air current flowing within the alternator. The arrangement has to be matched to the cooling air flow.

THE INVENTION

It is an object to provide a rectifier system for combination with an alternator which can be fitted in alternators of smaller size and which is so constructed that the space required by the rectifier system within the alternator structure is less than heretofore and which, in spite of drastic decrease in size, still permits loading of the rectifier with power levels comparable to existing systems levels.

Briefly, two support plates are provided of generally square plan outline. A first group of at least three positive diodes is located uniformly distributed in the vicinity of at least three of the corners of one support plate, and a second group of at least three negative diodes is located similarly uniformly distributed in the vicinity of at least three corners of the second support plate. A common carrier plate retains the respective first and second support plates, the common carrier plate preferably being an elongated element with a central portion and two wing portions, the wing portions each retaining the respective support plates and being angled off from the central portion of fit within the circular outline of an alternator.

The generally square plan outline has two of the at least three diodes located in the vicinity of the outer corners of the respective support plate, and at least one diode radially inwardly of the two diodes and close to a corner of the respective support plate. Four diodes can be mounted on each one of the respective support plates, so that one diode, each, will be mounted adjacent a corner, the fourth diode in each group then being connected to a center or star connection of the alternator winding, which improves balance in operation of the alternator.

The arrangement has the advantage that a substantially more compact construction is obtained with the additional and quite unexpected advantage of improved cooling of the power diodes.

The common carrier plate can easily support the exciter diodes, so that a unitary rectifier assembly is provided which simultaneously forms a support and cooling arrangement for the rectifier system without requiring any complex assembly within the housing of an alternator, or terminal connections which are difficult to make.

Due to the improved and novel orientation of the group elements which carry the power diodes, heat transfer is improved at a point between the respective diodes and the group element which carries the diode—a heat transfer location which previously has not been considered when designing the cooling support structure for the diodes themselves. This has been borne out experimentally. Measurements have shown that, due to improved heat transfer conditions between the respective diodes and the associated support plate, obtained primarily by the essentially square form of the support plate, and essentially symmertrical arrangement of the power diodes thereon, heat transfer from the rectifier system as a whole can be improved by about 25% with respect to prior art structures.

The invention permits compact rectifier systems which are located in a unitary rectifier housing, by encapsulating the diodes completely with an encapsulating compound, which can be reduced from 100 cm$^2$ of prior art structures to only about 25 cm$^2$. Again, the numerical values are selected only for comparable rectifiers as a matter of illustration, and to permit comparison, without limiting the invention to any specific size. Such structures, then, are particularly suitable for use in combination with three-phase alternators of compact construction.

The housing or support carrier structure for the individual support plates, in accordance with a particularly preferred form of the invention, has somewhat circular segmentally shaped form, and, preferably, has a bent-up ridge or end portion. This permits particularly good matching to the generally circular outline of an alternator housing, results in symmetrical arrangement of the rectifiers on the respective support plates, and further permits easy connection of the head leads from the respective diodes which, then, will be automatically offset with respect to each other. Thus, any diode pair can be connected together by a straight connecting wire or bus without requiring any kinking or bending. This drastically decreases assembling and connecting costs, which decrease is further enhanced by connecting the exciter diodes to the straight connecting wires or buses, further contributing to simplifying the assembly of all the diodes into a rectifier system.

DRAWINGS

FIG. 7 is a top view of a completely assembled rectifier system, illustrating placement of the diodes, and current buses for the power diodes as well as for the exciter diodes positioned on the common carrier plate on FIG. 5;

FIG. 8 is a side view, partly in section, of FIG. 7 in which elements have been omitted so that the electrical connection bus between two associated diodes is visible;

Figure 5:
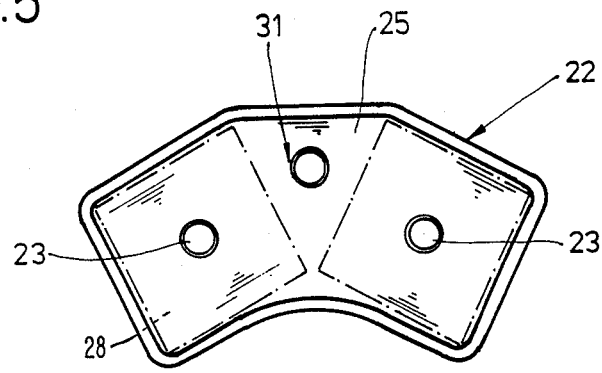
FIG. 5 is a schematic bottom view of a carrier plate structure to receive two group elements, as shown in FIG. 2, and, on the original patent drawing, to scale, and suitable for installation in a compact rectifier of a compact automotive-type alternator.
Figure 6:
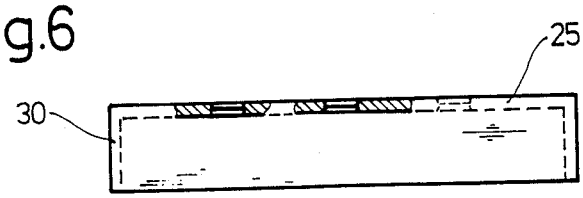
FIG. 6 is a side view of the common support plate, and forming a housing structure, of FIG. 5.
Figure 10:
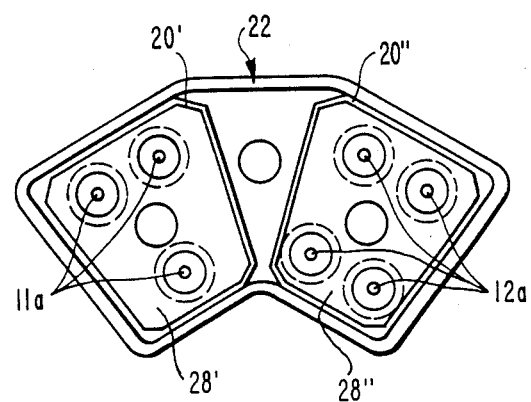

FIG. 9 is a fragmentary section illustrating placement of the exciter diodes on the common carrier plate, and their electrical connection to other components of the rectifier system thereof FIG. 10 is a highly schematic top view showing group elements of a shape differing from those of FIG. 5, in which the left group has three diodes and the right group has four diodes, and omitting all elements not necessary for an understanding of the difference.

DETAILED DESCRIPTION

The basic concept of the present invention is to locate two groups of power diodes on separate, substantially or generally square group parts which, again in essentially square placement, symmetrically recieve the diodes in suitable openings. This, initially, substantially reduces heat transfer resistance between the silicon chip and the bottom of the diodes. The respective group parts are then placed in good heat transfer relation on a common carrier support which, preferably, is formed with an upstanding rim to result in an essentially cup or pot-shaped housing so that, at a final assembly step, a potting compound can be used to encapsulate all components of the rectifier assembly. In accordance with a preferred feature of the invention, the group elements are so placed in the housing that screws, bolts and the like extending from the group parts simultaneously form the attachment elements of the compact rectifier system as well as the electrical connections and terminal elements for the alternator and the compact rectifier connected thereto.

Figure 1:
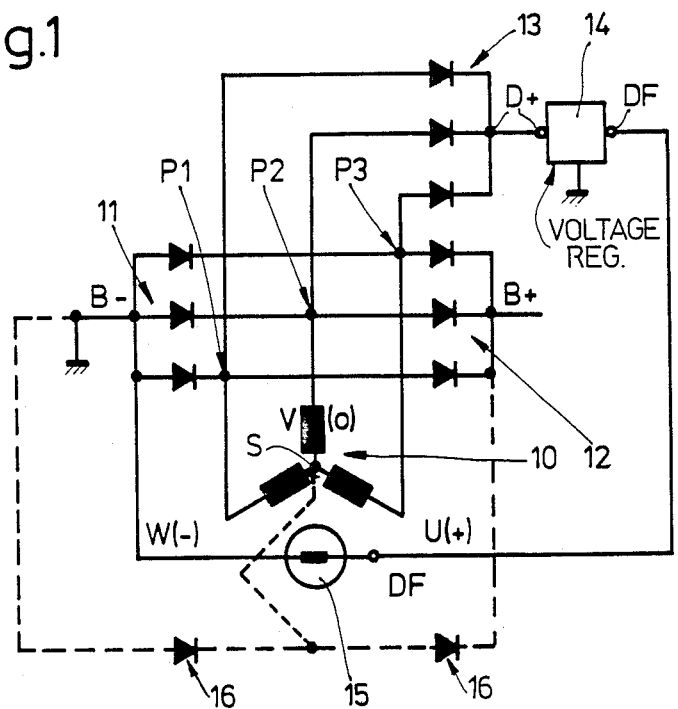
FIG. 1 is a general schematic diagram of the electrical connection of an automotive-type alternator and rectifier systems.

The general circuit diagram, used in accordance with the present invention, is known, but, for general understanding of the present invention, the electrical connection of an automotive-type alternator is shown in FIG. 1. The three-phase stator winding 10 has three terminals P1, P2 and P3 which, respectivley, are connected to the power rectifier diodes, formed by three negative diodes 11 and three positive diodes 12. The anodes of the negative diodes 11 are connected together and form the output terminal B−; the cathodes of the three positive diodes are connected together and form the positive or B+ terminal. The output voltage from the generator is then available between the terminals B+ and B−. The B− terminal customarily is grounded or connected to chasis of an automotive vehicle. Three exciter diodes 13 are connected to the respective phase terminals P1, P2, P3 with their anodes; the respective cathodes are connected together and form the D+ terminal, connected to a voltage regulator 14. Voltage regulator 14 has an output terminal DF which supplies output current to the exciter winding 15 if the alternator in accordance with the loading on the alternator, as well known. It has been found that a star or center terminal S formed by the phase windings can be used to supply additional current, in that it is not necessarily always at zero or null potential. Thus, FIG. 1 further shows that the star terminal S of the alternator windings is connected over an additional diode bridge pair 16 of the diode rectifier bridge taken from the phase output terminals. Thus, a circuit in accordance with this system will utilize eight powere diodes, namely four negative diodes and four positive diodes which are all connected to the respective B− and B+ terminals.

This arrangement thus permits and is basically so set that the diodes are press-fitted with their bases in respective reception or holding openings in the respective support plates or group plates. The base, in dependence on whether it is a minus or negative diode or a plus or positive diode, is connected either with the anode or the cathode of the diode chip, as well known.

Figure 2:
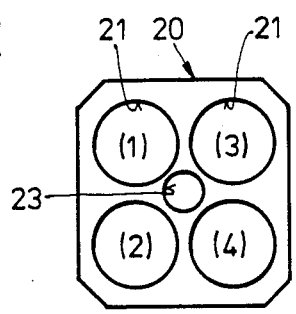
FIG. 2 is a top view of one group element having rectifier diodes press-fitted into a support plate, and forming part of the compact rectifier system.

FIG. 2 illustrates, to a somewhat enlarged scale, a square group support plate 20 in which four openings 21 are provided, located likewise in square arrangements and following teh square form of the support plate, to recieve the ring bases or base cups of the diodes of the respective rectifier group.

Measurements have been made comparing the essentially square or quadratic arrangement of the power diodes with respect to otehr arrangements and it has been found that a substantial improvement in heat conductivity can be obtained, which substantially increases the reliability of operation of the rectifier system. The arrangement includes four diodes, that is, the three phase power diodes 11, 12, as well as the star-connected diodes 16. Since the star-connected diodes 16 are not strictly necessary for operation of the rectifier and for the system as a whole, and the connection to the star terminal S is not strictly required, the connections of the diodes 16 are shown in broken lines.

Figure 4:
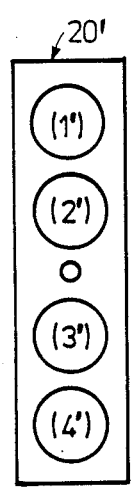
FIG. 4 is an illustration, presented for comparison purposes, and not forming part of the invention, and provided to permit comparison measurements of static heat transfer resistance between silicon chips and diode bodies for a square in-line placement of diodes, to permit comparison with the placement in accordance with the invention.
Figure 3:
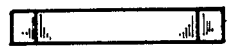
FIG. 3 is a side view of the group element of FIG. 2.

The table compares the static heat transfer resistance between the silicon chip and the diode body or base, in which each diode is located in square arrangement in a square support plate in accordance with FIG. 2, with a rectangular placement of the diodes in a rectangular support element, shown in FIG. 4, in which the plan surface of the square element 20 and the element 20′ of FIG. 4 are identical. The chip surface in each case is 14 mm², and the table compares the heat transfer resistance or "R" value of $R_{th}$ of the chip/bottom of the diode (K/W).

| diode position | rectangular arrangement (FIG. 4) | | | | square arrangement (FIG. 2) | | | |
|---|---|---|---|---|---|---|---|---|
|  | (1′) | (2′) | (3′) | (4′) | (1) | (2) | (3) | (4) |
| average | 1.26 | 0.95 | 0.87 | 1.52 | 0.86 | 0.93 | 0.74 | 0.90 |
|  |  | x = 1.15 | | | | x = 0.86 | | |

The improved heat transfer, in combination with additional improvements—to be described in detail below—permits a substantial reduction in size for the same power rectification, since the group elements, that is, the support plates on which the power diodes are seated now, in accordance with the invention in square arrangement, permit better heat transfer. The decrease in size, as clearly shown by the numerical comparison example in the table above, permits reduction of previously used support plates of 40 cm² to group parts of only 7 cm² base surface, with identical construction of power diodes and with only slightly decreased diameter, to 10 mm and decreased weight to 2.9 g.

Any one group element 20 can have diodes fitted therein by connecting their bases into the openings 21. Since the bases carry the current at the same voltage, a complete compact rectifier system requires for the eight power diodes her contemplated, two groups or support plates 28 (FIG. 8), each made of a suitable good heat conductive material. Aluminum or copper are preferred, each formed with essentially square outline and, preferably, with rounded or chamfered corners. The four power diodes 1, 2, 3, 4 pressed into the respective support plate 28, can be coated with a protective lacquer or varnish. At that time, they can be tested by electrical measurement, since they are not yet encapsulated with a plastic encapsulating compound. Corresponding diodes in the structure of FIG. 4, which is not the present invention, have been given the same reference numerals with prime notation.

Each group element 20 with the four rectifier diodes, protected by lacquer or varnish, is then fitted on a common carrier or housing plate which is shown, in top view, in FIG. 5. The common plate or housing 22 is generally rectangular, but angled off to form a somewhat half-moon or sickle shape to define a central portion and two angled-off wing portions, each one having part-rectangular outline, as best seen in FIG. 5, so that the support plates 28 of the respective groups can be placed at an angle with respect to each other, as shown in chain-dotted lines in FIG. 5.

Each one of the support plates 28 is formed with a preferably centrally located opening 23, which is symmetrically located between the four diodes. A bolt 24 is preferably press or interference-fitted into the opening 23. The pressed-in bolt which, in an actual embodiment, may be about 1cm long, with a metric M5 thread, is seated in the central bore 23 of each one of the support plates 28. These bolts 24 are used not only to retain the respective support plate 28 in the housing 22 (FIG. 5) of the compact rectifier, but, additionally, form the electrical terminals which carry current from the compact rectifier towards outside connections. Bolts 24, as shown in FIG. 8, are carried through suitable openings or bores in the base plate 25 of the common housing carrier 22 of the compact rectifier, and secured at the side remote from the support plate 28 with counter nuts 26, so that the respective groups 20 are thereby secured to the housing 1. As seen in FIG. 1, the bolts 24 then, simultaneously, form the attachment as well as the terminals for the rectified current, namely the terminals B+ and B— and a third bolt 24' can form the terminal D+. Of course, the B+ and D+ connected bolts are separated by plastic insulating sleeves 24a with respect to the common housing 22 which, typically, is of metal and, preferably, of good heat conductive metal. The plastic sleeve 24a, of which only the sleeve connected to bolt 24 and forming the B+ terminal is specifically identified for clarity, provides for insulation. Further, an electrically insulating intermediate layer 27, cut to fit beneath the respective support plate 28, separates the group element 28 (FIG. 7) carrying the positive diodes from the upper surface of the base plate 25 of housing 22. An insulating silicon foil is preferred. The foil is preferably cut to fit beneath the plates 28, but can extend over the entire upper surface of the base plate 25 of housing 22 (FIG. 8) with the bolts 24 passing therethrough.

The housing element 22 preferably is an aluminum injection casting with an upstanding rim 30 (FIG. 8) so that, after assembly and interconnection of the components and the housing by suitable buses, as will appear, a potting compound, for example a pourable and then curable, hardenable resin, can be poured into the structure, covering the diodes, the connecting buses, and exciter diodes 13.

The angled-off basic structure of the housing 22 provides for a central free space 31 (FIG. 5) in the angle between the two group element located in the wing portions. This angled-off region is utilized to receive a bus 32 (FIG. 7) which is connected to the exciter diodes 13. The structure, thus, has the additional advantage that all diode pairs, power diode pairs as well as exciter diode pairs, are compatcly located, with all space being utilized.

The diode 13 are shown in FIG. 8 at 33. A connecting terminal or bus 32 formed as an exciter base plate 32a with an upwardly angled leg 32b (FIG. 8) is connected by a press-fitted bolt 24' for the exciter diodes, and forming the D+ terminal, to the housing 22 through a plastic sleeve connection, not further identified for clarity in FIG. 8. As seen in FIG. 8, three externally extending terminals B+; B— and D+ will result. The upwardly bent leg 32b of the bus 32 receives one terminal of the exciter diode leads to provide a common terminal. In accordance with FIG. 1, the cathodes of the exciter diodes, connected together, form terminal D+. The small terminal leads of the exciter diodes (see FIG. 7) are connected to interconnection buses 34 between the head or connecting leads of the respectively associated positive and negative diodes 12, 11. The exister diodes are shown in FIG. 7 at 33 and, typically, are cyclindrical structures, self-supported between their connecting leads.

To connect the power diodes and exciter diodes, connecting buses 34 in bridge constuctors as shown in FIGS. 7 and 8, are first fitted between the head leads 12a, 11a (FIG. 8) of the positive and negative diodes 12, 11, respectively. Welding is the preferred connection. Due to the angled-odd or half-moon shape of the housing 22, straight connecting buses 34 can be used to connect the respective positive and negative diodes together, since any pair is spatially offset with respect to the next one.

After connecting the respective head leads, the free ends of the exciter diode connections are secured to the respective connecting buses 34, preferably also by welding, for example spot-welding. If desired, a fourth exciter diode can be provided which is connected to the star connection, in FIG. 7 the uppermost connecting bridge or bus 34'. Such a fourth exciter diode is not necessary, however, and has been omitted from FIG. 7 for clarity. It would only be necessary to somewhat laterally extend the upstanding part 32b of the connecting terminal 32 to accomodate a fourth diode in the angle portion 31 of the housing.

The entire assembly is then encapsulated by a potting compound or resin. The head wires or connecting wires of the power diodes of one group are made long enough so that they can extend outside of the resin, to permit connection to the phase terminal wires of the alternator stator winding, and to the star terminal S, if provided. At the bottom side of the assembly, the screws or bolts 24 and 24' permits connections to the output of the alternator and form the terminals B+, B— and D+, in which the terminals B+ and D+ are insulated with respect to the housing 22. Before encapsulating, the diode head wires of the group not needed for connection to the alternator stator windings can be cut off, as well as any wires extending from the excited diodes. Of course, the exciter diode terminal 32 is insulated from the housing 22, for example by the insulating silicon foil 27—see FIG. 8—or by an individual insulating foil or bushing.

It is possible, of course, to connect the housing 22 of the compact rectifier on an additional heat sink or cooling fin or cooling structure, for example by riveting or screw connection, in accordance with the internal arrangement of the alternator with which it is to be used.

The essentially square arrangement of the respective rectifier groups results in essentially uniform, and on average, lower heat transfer resistance between the respective silicon chip of a rectifier diode and the bottom of the diode structure. This permits a small base surface for any one of the support plate groups, and good heat conduction, combined in one single structure.

The angular placement of the groups with respect to each other simplifies not only the electrical connection, but also assembly and mounting of the components of the compact rectifier within the housing. The connecting lines as well as the electrical buses between two associated diodes are straight and extend in the same distance with respect to each other, so that, between the groups, there is space for reception of a common current rail 32 for the exciter diodes 13. This substantially facilitates connection of the exciter diodes to the connecting buses between the power diodes, since the space between the respective positive and negative diode groups is readily accessible.

Screw connection between the group elements and the housing bottom, especially in the form of interference pressed-in bolts, with an external screw thread, is a preferred arrangement, since no counter holding of screws is necessary when the nuts 26 are secured on the bolts 24.

FIG. 10 illustrates, highly schematically, different shapes of the support plates 28', 28". Support plate 28' carries thres diodes; support plate 28", identical in outline to plate 28', but having the extra opening for a fourth diode, carries four diodes.

The first support plate 28' is of generally truncated sector or trapezoidal shape. Likewise, the second support plate 28' is of truncated sector or trapezoidal shape. These plates, respectively, retain the groups 20', 20". The group 20", with four diodes, may normally be connected with only three.

Various changes and modifications may be made within the scope of the inventive concept, and features described in any one of the drawings can be used with any of the others.

We claim:

1. Mobile-type three-phase alternator rectifier system combination, in which the alternator has three phase output terminals (P1, P2, P3), and said rectifier system has a first group of at least three positive diodes (12) having a base forming one terminal and an extending lead forming a positive terminal;

a second group of at least three negative diodes (11) having a base forming one terminal and an extending lead forming a negative terminal;

connecting buses (34) coupled to the respective phase output terminals of the alternator;

the bases of the first group of diodes being connected in common and forming a positive output terminal (B+) of the combination;

the bases of the second group of diodes being connected in common and forming a negative terminal (B−) of the combination, and comprising, in accordance with the invention, a first support plate (28) of generally square plan outline, the first group of at least three positive diodes being located uniformly distributed in the vicinity of at least three corners of the first support plate;

a second support plate (28) of generally square plan outline, the second group of at least three negative diodes being located uniformly distributed in the vicinity of at least three corners of the secon support plate; and a common carrier plate (22) on which said first and second support plates (28) are mounted.

2. The combination of claim 1, wherein four positive diodes (12) and four negative diodes (11) are provided, one each being located in the vicinity of the corners of the respective support plates (28);

and wherein the common carrier plate (25) is elongated, said first and second support plates being positioned adjacent, but spaced from each other with one corner close to each other and said carrier plates being located angularly with respect to each other on said common carrier plate.

3. The combination of claim 1, further comprising an attachment bolt (24) secured to each of said support plates, passing through a respective opening in the common carrier plate, and attaching the respective support plate to the common carrier plate.

4. The combination of claim 3, wherein the attachment bolt (24) is located essentially centrally in the respective support plates (28) and press-fitted therein;

and wherein the press-fitted attachment bolt is screw-connected to the common carrier plate (22).

5. The combination of claim 3, wherein the attachment bolts (24) connected to the respective first and second support plated from the respective positive and negative output terminals of said combination (B+, B−).

6. The combination of claim 1, wherein said common carrier plate (22) is, in plan outside, part-segmental shaped, having a central portion and two wing portions extending on either side from said central portion, said wing portions being shaped and dimensioned to receive, respectively, the first and second support plates, angularly positioned with respect to each other.

7. The combination of claim 6, wherein said common carrier plate forms part of a housing structure (22), said housing structure having a bottom (25) and an upstanding rim (30);

and wherein an encapsulating or potting compound is retained between the botom and said upstanding rim, encapsulating said groups of rectifiers, and said support plates.

8. The combination of claim 7, further including a group exciter or field diodes (13) 133 coupled to said connecting buses (34);

and wherein said encapsulating or potting compound extends over said connecting buses and encapsulates also said exciter or fields diodes.

9. The combination of claim 6, wherein said connecting buses (34) are essentially straight connecting elements, interconnecting the second terminals (12a, 11a) of aligned diodes of the first group and of the second group (12a, 11a), said connecting elements extending essentially parallel to each other and in a chord direction with respect to the common carrier plate (22).

10. The combination of claim 6, wherein the central portion of the common carrier plate forms an essentially V-shaped region free from said first and second support plates (20);

at least three exciter or field diodes (13, 33) are provided, and positioned in said free space (31);

and a terminal element (32) is provided, forming a common connection point for one of the terminals of said exciter or field diodes, and secured to said common carrier plate in insulated relation thereto.

11. The combination of claim 10, further including a bolt connection between said terminal element (32) and said common carrier plate (22) and forming an exciter or field terminal (D+) of said combination.

12. The combination of claim 10, wherein said connecting buses (34) are essentially straight connecting elements, interconnecting the second terminals of aligned diodes of the first group and of the second group, said connecting elements extending essentially parallel to each other and in a chord direction with respect to the common carrier plate (22);

and wherein the terminal element (32) comprises an angled structure having an upstanding leg (32) and forming a common connection terminal for said one terminals of the exciter or field diodes (13, 33), the other terminals of said exciter or field diodes being electrically and mechanically secured to respective ones of said connecting buses.

13. The combination of claim 1, wherein the alternator phase windings have a center or star connection terminal (S);

and wherein four positive and negative diodes, respectively, are provide, a fourth negative and positive diode pair being connected to said star terminal.

14. The combination of claim 1, further comprising an attachment bolt (24) secured to each of said support plates (28), passing through a respectibe opening in the common carrier plate (22), and attaching the respective support plate to the common carrier plate;

and wherein those of said attachment bolts which are at an elevated voltage with respect to said common carrier plate include an insulating sleeve insulating said bolts with respect to said common carrier plate.

15. The combination of claim 1, further including an insulating foil (27) mechanically isolating and electrically insulating at least the first support plate carrying the positive diodes (12) with respect to said common carrier plate.

16. The combination of claim 11, further including an insulating foil (27) mechanically isolating and electrically insulating at least said first support plate and said terminal element (22) with respect to the said common carrier plate.

17. Mobile-type three-phase alternator rectifier system, in which the alternator has three phase output terminals (P1, P2, P3), and said rectifier system has a first group of at least three positive diodes (12) having a base forming one terminal and an extending lead forming a positive terminal;

a second group of at least three negative diodes (11) having a base forming one terminal and an extending lead forming a negative terminal;

connecting buses (34) coupled to the respective phase output terminals of the alternator;

the base of the first group of diodes being connected in common and forming a positive output terminal (B+) of the combination;

the base of the second group of diodes being connected in common and forming a negative terminal (B−) of the combination, and comprising, in accordance with the invention, a first support plate (28), of generally truncated sector or trapezoidal shape, two of the at least three positive diodes (12) being located in the vicinity of an outer perimeter of said support plate, and at least one diode being located radically inwardly of said two diodes;

a second support plate (28') of truncated sector or trapezoidal shape, two of the at least three negative dioides (11) being located in the vicinity of an outer perimeter of the support plate and at least one diode being located radially inwardly of said two diodes;

an elongated common carrier plate (22) of angled shape, having a central portion (31) and two wing portions extending laterally from said central portion, said first and second support plates (20) being located in said wing portions;

and attachment means (24) attaching said support plates (28) to said common carrier plate in intimately heat-conducting relation.

18. The system of claim 17, wherein at least one of said groups has four diodes, two diodes being located on the respective first and second support plate radially inwardly of said two diodes located in the vicinity of the outer perimeter of the respective support plate.

19. The system of claim 17, wherein said connecting buses (34) are essentially straight connecting elements extending in a chord direction across said central portion (31) and interconnecting said second terminals of respective diodes of said first and second groups of positive and negative diodes.

20. The system of claim 19, further including a group of exciter or field diodes (13, 33) located in said central portion and having one terminal, each, connected to said buses;

a terminal element (32) connecting the second terminals of said exciter or field diodes in common;

and connecting bolt means (24') securing said terminal element (32) to said common carrier plate, insulated therefrom, and forming an exciter or field output terminal (D+) of said combination.

* * * * *